US008498116B2

(12) United States Patent
Siracki (10) Patent No.: US 8,498,116 B2
(45) Date of Patent: Jul. 30, 2013

(54) HEAT SINK FOR POWER CIRCUITS

(75) Inventor: Glenn T. Siracki, Burton, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 198 days.

(21) Appl. No.: 12/838,089

(22) Filed: Jul. 16, 2010

(65) Prior Publication Data

US 2012/0014067 A1 Jan. 19, 2012

(51) Int. Cl.
*H05K 7/20* (2006.01)
(52) U.S. Cl.
USPC ........... 361/710; 361/690; 361/703; 361/704; 165/80.3; 165/185
(58) Field of Classification Search
USPC ..... 361/679.54, 697, 704, 709, 710; 165/185; 174/16.3
See application file for complete search history.

(56) References Cited

U.S. PATENT DOCUMENTS

| | | | | |
|---|---|---|---|---|
| 851,977 | A * | 4/1907 | Bigsby et al. | 165/183 |
| 4,669,535 | A * | 6/1987 | Seidler | 165/78 |
| 5,419,041 | A * | 5/1995 | Ozeki | 29/890.03 |
| 5,819,407 | A * | 10/1998 | Terada | 29/890.03 |
| 6,000,462 | A * | 12/1999 | Gonner | 165/80.3 |
| 6,009,937 | A * | 1/2000 | Gonner et al. | 165/185 |
| 6,076,594 | A * | 6/2000 | Kuo | 165/80.3 |
| 6,199,627 | B1 * | 3/2001 | Wang | 165/185 |
| 6,722,419 | B1 * | 4/2004 | Lee | 165/80.3 |
| 6,771,502 | B2 * | 8/2004 | Getz et al. | 361/703 |
| 6,883,592 | B2 * | 4/2005 | Lee | 165/80.3 |
| 7,068,514 | B2 * | 6/2006 | Chang et al. | 361/705 |
| 7,120,020 | B2 * | 10/2006 | Carter et al. | 361/697 |
| 7,200,934 | B2 * | 4/2007 | Carter et al. | 29/890.03 |
| 7,441,593 | B2 * | 10/2008 | Wu | 165/185 |
| 7,911,790 | B2 * | 3/2011 | Carter et al. | 361/697 |
| 8,051,896 | B2 * | 11/2011 | Wayman | 165/80.3 |
| 8,056,614 | B2 * | 11/2011 | Chen et al. | 165/80.3 |
| 2002/0020523 | A1 * | 2/2002 | Sheu | 165/185 |
| 2006/0023423 | A1 * | 2/2006 | Kuo et al. | 361/697 |
| 2007/0223196 | A1 * | 9/2007 | Kuo et al. | 361/710 |

(Continued)

FOREIGN PATENT DOCUMENTS

JP 2003318339 A * 11/2003

OTHER PUBLICATIONS

Thermal Integration TI-RV104N Heatsink Review, Mar. 8, 2004, http://www.frostytech.com/articleview.cfm?articleID=1556, Accessed Feb. 22, 2013.

(Continued)

*Primary Examiner* — Boris Chervinsky
(74) *Attorney, Agent, or Firm* — Fletcher Yoder, P.C.; Alexander A. Kuszewski; John M. Miller (57) ABSTRACT

The present invention relates generally to a heat sink comprising a plurality of fins, each fin having two or more prongs extending from a root section of the fin. In certain embodiments, the heat sink may be assembled by aligning the plurality of fins within slots between protrusions extending from a base of the heat sink. However, in other embodiments, the plurality of fins may have connector ends having female sides and opposite male sides, wherein the plurality of fins may be attached to each other via the interlocking female and male sides, thereby forming at least part of the base of the heat sink, and fortified with reinforcing members.

14 Claims, 7 Drawing Sheets

U.S. PATENT DOCUMENTS

2009/0178782 A1* 7/2009 Guyon et al. .......... 165/80.3
2009/0288806 A1 11/2009 Lin
2011/0226458 A1* 9/2011 Plonski et al. .......... 165/185

OTHER PUBLICATIONS

Evercool PT02-9232CP Bifurcated Fin Heatsink, Nov. 16, 2006, http://www.frostytech.com/articleview.cfm?articleID=2029, Accessed Feb. 22, 2013.

Augmented-Fin Air-Cooled Heat Sinks, http://www.digikey.com/Web%20Export/Supplier%20Content/Aavid_59/PDF/Aavid_Augmentated_Heatsinks.pdf?redirected=1, Accessed Feb. 22, 2013.

\* cited by examiner

HEAT SINK FOR POWER CIRCUITS

BACKGROUND

The present invention relates generally to the field of power electronic devices such as those used in power conversion or applying power to motors and similar loads. More particularly, the invention relates to an improved heat sink for use in power circuits.

In the field of power electronic devices, a wide range of circuitry is known and currently available for converting, producing, and applying power to loads. Depending upon the application, such circuitry may convert incoming power from one form to another as needed by the load. In a typical arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Many other applications exist, however, for power electronic circuits which can convert alternating current power to direct current power (or vice versa) or that otherwise manipulate, filter, or modify electric signals for powering a load. Circuits of this type generally include rectifiers (converters), inverters, and similar switched circuitry. For example, a motor drive will typically include a rectifier that converts AC power to DC. Power conditioning circuits, such as capacitors and/or inductors, are often employed to remove unwanted voltage ripple on the internal DC bus. Inverter circuitry can then convert the DC signal into an AC signal of a particular voltage and frequency desired for driving a motor at a particular speed or torque. The inverter circuitry typically includes several high power semiconductor devices, such as insulated-gate bipolar transistors (IGBTs), silicon controlled rectifiers (SCRs), and diodes, controlled by drive circuitry.

The motor drive circuitry detailed above will typically generate substantial amounts of heat, which must be dissipated to avoid damaging heat sensitive electronics. Typically, therefore, some form of cooling mechanism may be employed to enhance heat extraction and dissipation. Often, the circuitry is packaged together as a unit with a built-in cooling channel that provides cool air to several components. Because the air within the channel is heated as it travels through the channel, components near the exhaust end of the air channel will usually experience a diminished cooling effect. Therefore, as packaged control units become more compact, the need for efficient heat dissipation becomes more critical. Additionally, as the workload or motor speed changes, the temperature of the semiconductors generally increases, causing higher failure rates and reduced reliability. The output of the unit is often, therefore, limited by the maximum temperature that the unit can handle without substantially increasing the risk of failure. A more effective cooling mechanism would, therefore, allow the motor drive to operate at higher motor power levels. Therefore, it may be advantageous to provide a motor drive with an improved cooling mechanism. In particular, it may be advantageous to provide a cooling mechanism which provides a reduced airflow resistance and increased air flow while maintaining a high level of thermal performance.

BRIEF DESCRIPTION

The present invention relates generally to a heat sink comprising a plurality of fins, each fin having two or more prongs extending from a root section of the fin. In certain embodiments, the heat sink may be assembled by aligning the plurality of fins within slots between protrusions extending from a base of the heat sink. However, in other embodiments, the plurality of fins may have connector ends having female sides and opposite male sides, wherein the plurality of fins may be attached to each other via the interlocking female and male sides, thereby forming at least part of the base of the heat sink, and fortified with reinforcing members.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
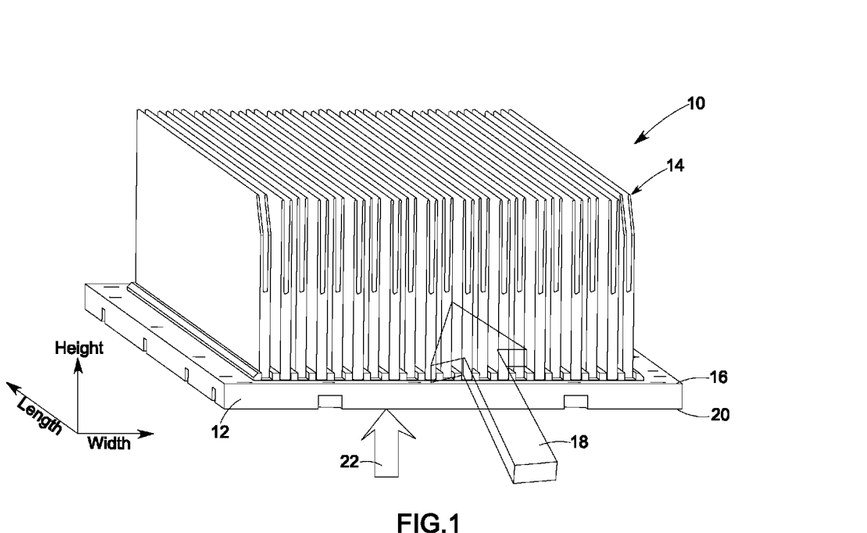
FIG. 1 is a perspective view of an exemplary embodiment of a high heat dissipation heat sink for use in power circuits.

Turning to the figures, FIG. 1 is a perspective view of an exemplary embodiment of a high heat dissipation heat sink 10 for use in power circuits, as described above. As illustrated, the heat sink 10 may include a base 12 and a plurality of fins 14 extending from the base 12. As described in greater detail below, in certain embodiments, the fins 14 may be manufactured (e.g., extruded) such that the fins 14 may be inserted into slots on a top surface 16 of the base 12 such as in FIGS. 2 and 3. However, in other embodiments, the fins 14 may be manufactured such that the fins 14 may be attached to each other with the attachment area forming at least part of the base 12 such as in FIGS. 4 through 6.

Air may flow through the plurality of fins 14, as depicted by arrow 18. The air flow 18 through the fins 14 may help dissipate the heat that flows from the bottom surface 20 through the top surface 16 of the base 12 and into the fins 14, as depicted by arrow 22. As described in greater detail below, each individual fin 14 may include two or more prongs extending from a root section of the fin 14 away from the base 12. Using two or more prongs for each fin 14 extending from the root section increases the overall convective heat transfer surface area of the heat sink 10 while maintaining structural stability of the heat sink 10. More specifically, the pronged fins 14 increase surface and flow areas as compared to traditional or solid tapered fins. The pronged fins 14 also reduce backpressure and increase the flow rate of cooling air.

Figure 2:
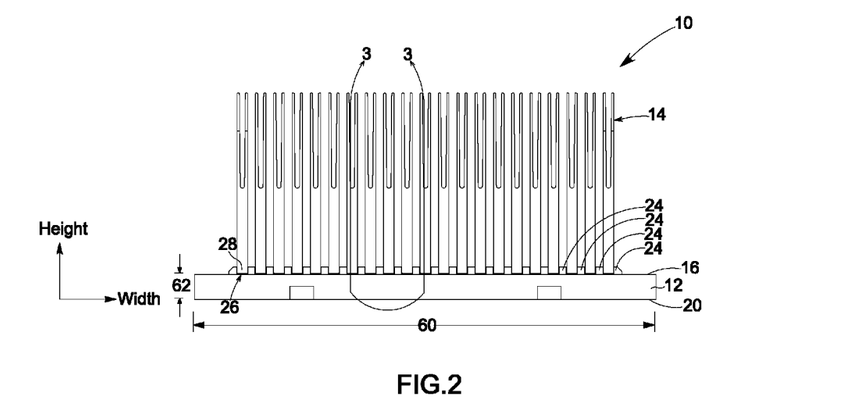
FIG. 2 is a side view of an exemplary embodiment of the heat sink having a plurality of pronged fins in a bonded construction configuration.
Figure 3:
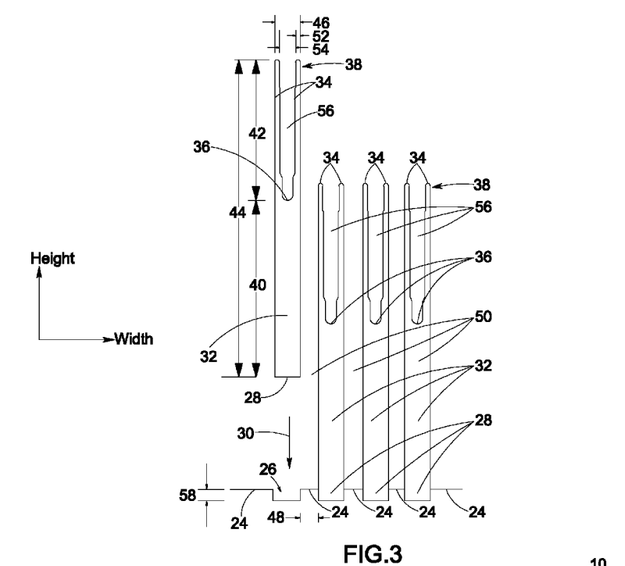
FIG. 3 is a side view of an exemplary embodiment of the heat sink, illustrating four of the pronged fins of the bonded construction configuration of FIG. 2.

FIG. 2 is a side view of an exemplary embodiment of the heat sink 10 having a plurality of pronged fins 14 in a bonded construction configuration. As illustrated, in this embodiment, the heat sink 10 of FIG. 2 comprises an integral base 12 with the pronged fins 14 being attached to the base 12 between a plurality of protrusions 24 that extend lengthwise along the top surface 16 of the base 12. In particular, during assembly of the heat sink 10, the pronged fins 14 are inserted into slots 26 formed between the plurality of protrusions 24. As described in greater detail below, once the pronged fins have been inserted into the slots 26, the protrusions 24 and root ends 28 of the root sections of the pronged fins 14 may be bonded together. For example, FIG. 3 is a side view of an exemplary embodiment of the heat sink 10, illustrating four of the pronged fins 14 of the bonded construction configuration of FIG. 2. As illustrated, each of the pronged fins 14 may be inserted into the slots 26 between the protrusions 24, as illustrated by arrow 30. The bonding of the root ends 28 of the root sections 32 of the pronged fins 14 to the protrusions 24 of the base 12 may be accomplished via brazing, thermally conductive epoxy, friction or vibratory welding, or any other suitable methods.

As illustrated in FIG. 3, in certain embodiments, each of the pronged fins 14 may generally have the same cross-sectional profile. However, in other embodiments, the pronged fins 14 may have slightly different cross-sectional profiles, depending on heat dissipation characteristics across the width and length of the heat sink 10. As illustrated in FIG. 3, each pronged fin 14 includes a root section 32 and two or more prongs 34 extending from the root section 32 away from the root end 28 of the pronged fin 14. In particular, the prongs 34 may extend from a junction point 36 (e.g., a transition point) of the pronged fin 14 and extend to a prong end 38 of the pronged fin 14. Relative to traditional fins, the prongs 34 increase the air flow area and reduce system pressure during operation. As illustrated, the prongs 34 extending from the root section 32 are parallel to each other and the root section 32. The parallel design of the pronged fins 14 facilitates the assembly of multiple pronged fins 14 in an interchangeable manner.

The height 40 of the root section 32 is specific to the depth of the duct within which the heat sink 10 is used, and the degree to which cooling air may be bypassed around the tops of the prongs 34. In addition, the height 42 of the prongs 34 is generally regulated by the width 46 of the root section 32. In certain embodiments, the ratio of the height 40 of the root section 32 to the height 44 of the pronged fin 14 may be within a range of approximately 40-55%, whereas the ratio of the height 42 of the prongs 34 to the height 44 of the pronged fin 14 may be within a range of approximately 45-60%. For example, the height 40 of the root section 32 may be within a range of approximately 45-75 mm, the height 42 of the prongs 34 may be within a range of approximately 50-80 mm, and the height 44 of the pronged fin 14 may be within a range of approximately 100-140 mm. However, in other embodiments, these relative and absolute dimensions may vary from the ranges and values included herein.

Similarly, the width 46 of the root section 32 of the pronged fin 14 with respect to the height 44 of the pronged fin 14 may vary between embodiments. In certain embodiments, the ratio of the height 44 of the pronged fin 14 to the width 46 of the root section 32 of the pronged fin 14 may be within a range of approximately 14:1-18:1. For example, the width 46 of the root section 32 of the pronged fin 14 may be within a range of approximately 6-10 mm based on the height 44 of the pronged fin 14 being within a range of 84-180 mm. However, in other embodiments, these relative and absolute dimensions may vary from the ranges and values included herein. In certain embodiments, the width 46 of the root section 32 of the pronged fin 14 may not be constant along the entire height of the pronged fin 14. Rather, the prongs 34 may form a slight Y formation from the junction point 36. The relative thickness of the width 46 of the root section 32 of the pronged fin 14 facilitates heat flow to the prongs 34 of the pronged fin 14. In addition, once assembled, the width 48 of the gaps 50 between pronged fins 14 with respect to the height 44 of the pronged fin 14 may facilitate air flow through the heat sink 10.

The width 48 of the gaps 50 may vary between embodiments depending on desired lateral temperature gradient within the power device and so forth. Indeed, in certain embodiments, the width 48 of the gaps 50 may vary between adjacent pronged fins 14. In certain embodiments, the ratio of the height 44 of the pronged fin 14 to the width 48 of the gaps 50 between pronged fins 14 may be within a range of approximately 22:1-26:1. For example, the width 48 of the gaps 50 between pronged fins 14, which is generally the same as the width of the protrusions 24, may be within a range of approximately 4-6 mm based on the height 44 of the pronged fin 14 being within a range of 88-156 mm. However, in other embodiments, these relative and absolute dimensions may vary from the ranges and values included herein. As described above, the root section 32 is quite thick, facilitating heat flow to the prongs 34 of the pronged fin 14. For example, in certain embodiments, the width 46 of the root section 32 of the pronged fin 14 is greater than the width 48 of the gaps 50 between pronged fins 14 by approximately 50-70%. However, in other embodiments, these relative dimensions may vary from this range.

The disclosed embodiments enable much higher ratios of the height 44 of the pronged fins 14 to the width 48 of the gaps 50 between pronged fins 14 than typical heat sink fins due at least in part to the separate manufacturing of the pronged fins 14. In other words, as opposed to conventional techniques where heat sink fins are extruded from the base of the heat sink, manufacturing the pronged fins 14 separate from the base 12 and then assembling the pronged fins 14 and the base 12 enables much higher height-to-width ratios. As described above, once assembled, the ratio of the height 44 of the pronged fin 14 to the width 48 of the gaps 50 between pronged fins 14 may be within a range of approximately 22:1-26:1. The high aspect ratio may utilize the depth (e.g., height) of the ducts, within which the heat sink 10 is used, to increase surface and flow areas as compared to traditional or solid tapered fins. The pronged fins 14 also reduce backpressure and increase the flow rate of cooling air.

In addition, each pronged fin 14 may be extruded with a high aspect ratio between prongs 34 of the fin 14. As illustrated in FIG. 3, the width 52 of the prongs 34 may vary slightly from the junction point 36 of the pronged fin 14 to the prong end 38 of the pronged fin 14. Similarly, the width 54 of the gap 56 between the prongs 34 of the fin 14 may vary slightly from the junction point 36 of the pronged fin 14 to the prong end 38 of the pronged fin 14. However, in general, the width 52 of each of the prongs 34 may be within a range of approximately 21-37% of the width 46 of the root section 32 of the pronged fin 14. For example, the width 52 of each of the prongs 34 may be within a range of approximately 1.25-3.7 mm based on the width 46 of the root section 32 of the pronged fin 14 being within a range of 6-10 mm. As such, the width 54 of the gap 56 between the prongs 34 of the fin 14 may be within a range of approximately 26-58% of the width 46 of the pronged fin 14. For example, the width 54 of the gap 56 between the prongs 34 of the fin 14 may be within a range of approximately 3-6 mm based on the width 46 of the pronged fin 14 being within a range of 6-10 mm. However, in other embodiments, these relative and absolute dimensions may vary from the ranges and values included herein. As described in greater detail below, the area between the prongs 34 of the fin 14 will have an aspect ratio within a range of approximately 16:1-20:1. The relatively high aspect ratio of the area between the prongs 34 increases the surface area for convective heat transfer from each pronged fin 14.

In addition, in certain embodiments, the depth 58 of the slots 26 between the protrusions 24 may be approximately 4.5 mm. In general, the depth 58 of the slots 26 between the protrusions 24 will be selected to provide stability of the pronged fins 14 when bonded to the top surface 16 of the base 12 of the heat sink 10.

Returning now to FIG. 2, although illustrated as having 21 pronged fins 14 attached to the base 12 of the heat sink 10, in other embodiments, various number of pronged fins 14 may be attached to the base 12 of the heat sink 10. For example, the number of pronged fins 14 attached to the base 12 of the heat sink 10 may be within a range of approximately 10-25. As such, in certain embodiments, the width 60 of the base 12 of the heat sink 10 may be within a range of approximately 320-500 mm or greater, whereas the height 62 of the base 12 of the heat sink 10 may be within a range of approximately 15-30 mm. In particular, the height 62 of the base 12 of the heat sink 10 may be within a range of approximately 20-30% of the height 44 of each pronged fin 14 based on the height 44 of the pronged fin 14 being within a range of 100-140 mm. However, in other embodiments, these relative and absolute dimensions may vary from the ranges and values included herein. In general, the height 62 of the base 12 is a function of the power density (e.g., watts per cubic centimeter) of the power device. As described above, the base 12 of the heat sink 10 is relatively thick, enabling heat conduction to a larger area so that the pronged fins 14 share more of the heat load.

Figure 4:
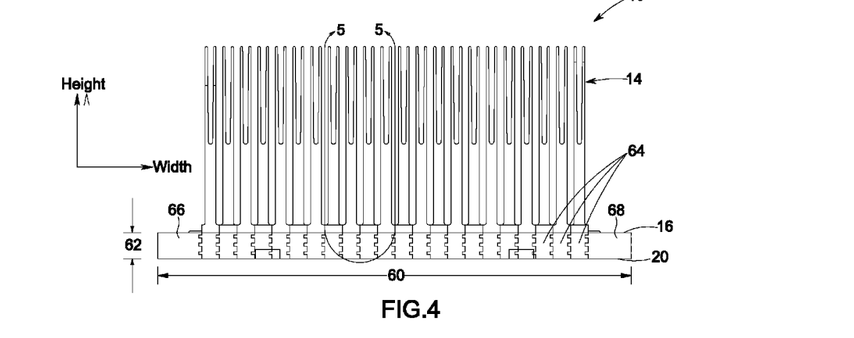
FIG. 4 is a side view of an exemplary embodiment of the heat sink having a plurality of pronged fins in a laminated construction configuration.

Present embodiments are not limited to the bonded construction configuration illustrated in FIGS. 2 and 3. Indeed, there are several designs that may be used with the pronged fins 14 described herein. For example, FIG. 4 is a side view of an exemplary embodiment of the heat sink 10 having a plurality of pronged fins 14 in a laminated construction configuration. As illustrated, instead of having a plurality of pronged fins 14 that are attached to the top surface 16 of the base 12, each pronged fin 14 may instead include a connector end 64, wherein each connector end 64 may interlock with connector ends 64 of adjacent pronged fins 14 when assembled. In particular, the plurality of pronged fins 14 may be connected together via the interlocking connector ends 64 along the width of the heat sink 10 between a first mounting flange 66 and a second mounting flange 68, which also have interlocking features that mate with the interlocking features of the connector ends 64 of the pronged fins 14. As such, in this embodiment, the connector ends 64 of the pronged fins 14 will form a majority of the base 12, as opposed to the integrated base 12 illustrated in FIGS. 2 and 3. Once the plurality of pronged fins 14 are connected via the interlocking connector ends 64 and assembled between the mounting flanges 66, 68, the bottom surface 20 of the assembled base 12 may be laminated to create a smooth bottom surface 20 of the heat sink 10 for equally distributing the heat.

Figure 5:
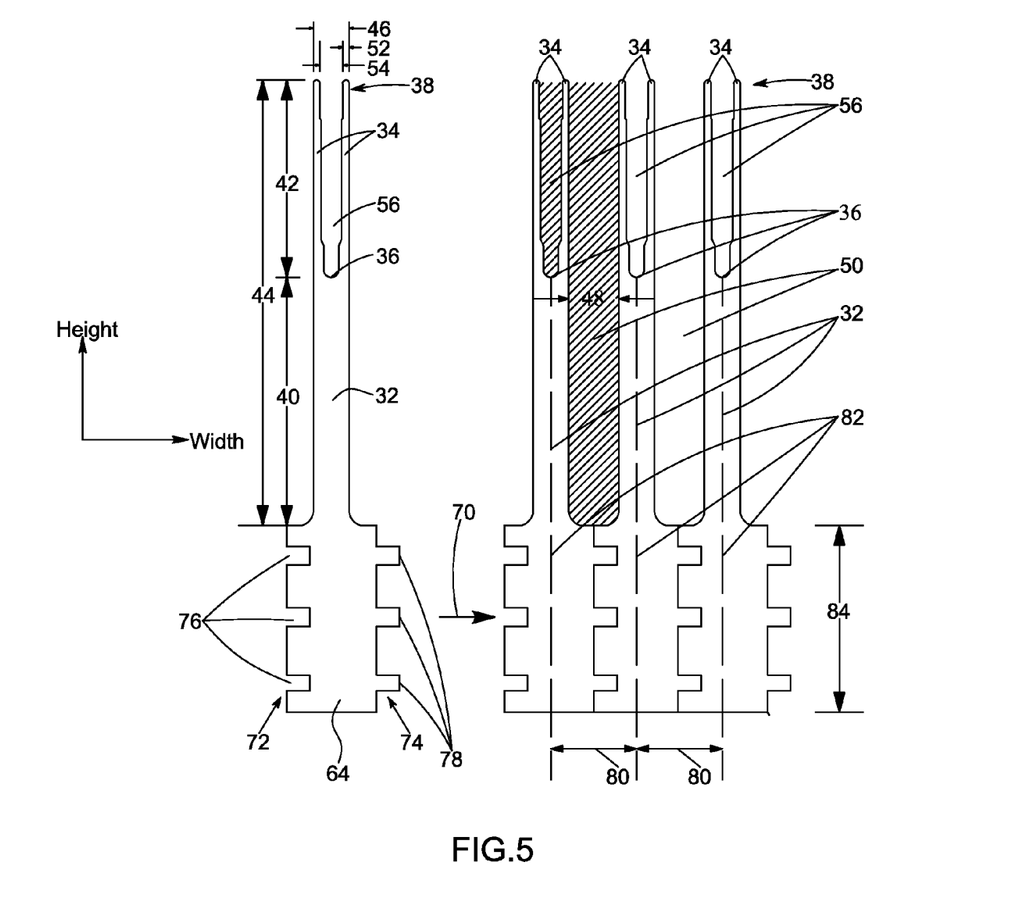
FIG. 5 is a side view of an exemplary embodiment of the heat sink, illustrating four of the pronged fins of the laminated construction configuration of FIG. 4.

For example, FIG. 5 is a side view of an exemplary embodiment of the heat sink 10, illustrating four of the pronged fins 14 of the laminated construction configuration of FIG. 4. As illustrated by arrow 70, each of the pronged fins 14 may be connected to each other via the connector ends 64. The connector ends 64 may include any suitable interlocking features. For example, as illustrated in FIG. 5, in certain embodiments, the connector ends 64 may include a female side 72 and an opposite male side 74, with the female side 72 having indentions 76 that mate with protrusions 78 of the male side 74. Although illustrated as having a female side 72 with three indentions 76 and a male side 74 with three mating protrusions 78, any suitable number of indentions 76 and mating protrusions 78 may be used in certain embodiments.

Because the indentions 76 of the female side 72 mate with the protrusions 78 of the male side 74, the effective width 80 of the connector ends 64 is equal to the width between centerlines 82 of adjacent pronged fins 14. In certain embodiments, the effective width 80 of the connector end 64 of the pronged fin 14 with respect to the height 44 of the pronged fin 14 may vary between embodiments. In certain embodiments, the ratio of the height 44 of the pronged fin 14 (i.e., the height 40 of the root section 32 plus the height 42 of the prongs 34) to the effective width 80 of the connector end 64 of the pronged fin 14 may be within a range of approximately 9.5:1-10.2:1. For example, the effective width 80 of the connector end 64 of the pronged fin 14 may be within a range of approximately 12-16 mm based on the height 44 of the pronged fin 14 being within a range of 114-163 mm. In certain embodiments, the height 84 of connector end 64 of the pronged fin 14 may be within a range of approximately 20-25 mm based on the height 44 of the pronged fin 14 being within a range of 100-140 mm. However, in other embodiments, these relative and absolute dimensions may vary from the ranges and values included herein.

As illustrated in FIG. 5, in certain embodiments, each of the pronged fins 14 may generally have the same cross-sectional profile. However, in other embodiments, the pronged fins 14 may have slightly different cross-sectional profiles, depending on heat dissipation characteristics across the width and length of the heat sink 10. As illustrated in FIG. 5, each pronged fin 14 includes the root section 32 and two or more prongs 34 extending from the root section 32 away from the connector end 64 of the pronged fin 14. As described above, the prongs 34 may extend from the junction point 36 of the pronged fin 14 and extend to the prong end 38 of the pronged fin 14. The height 40 of the root section 32 with respect to the height 42 of the prongs 34 may vary between embodiments. In certain embodiments, the ratio of the height 40 of the root section 32 to the height 44 of the pronged fin 14 may be within a range of approximately 40-55%, whereas the ratio of the height 42 of the prongs 34 to the height 44 of the pronged fin 14 may be within a range of approximately 45-60%. For example, the height 40 of the root section 32 may be within a range of approximately 45-75 mm, the height 42 of the prongs 34 may be within a range of approximately 50-80 mm, and the height 44 of the pronged fin 14 may be within a range of approximately 100-140 mm. However, in other embodiments, these relative and absolute dimensions may vary from the ranges and values included herein.

Similarly, the width 46 of the root section 32 of the pronged fin 14 with respect to the height 44 of the pronged fin 14 may vary between embodiments. In certain embodiments, the ratio of the height 44 of the pronged fin 14 to the width 46 of the root section 32 of the pronged fin 14 may be within a range of approximately 14:1-18:1. For example, the width 46 of the root section 32 of the pronged fin 14 may be within a range of approximately 6-10 mm based on the height 44 of the pronged fin 14 being within a range of 84-180 mm. However, in other embodiments, these relative and absolute dimensions may vary from the ranges and values included herein. In addition, once assembled, the width 48 of the gaps 50 between pronged fins 14 with respect to the height 44 of the pronged fin 14 may vary between embodiments. In certain embodiments, the ratio of the height 44 of the pronged fin 14 to the width 48 of the gaps 50 between pronged fins 14 may be within a range of approximately 22:1-26:1. For example, the width 48 of the gaps 50 between pronged fins 14 may be within a range of approximately 4-6 mm based on the height 44 of the pronged fin 14 being within a range of 88-156 mm. However, in other embodiments, these relative and absolute dimensions may vary from the ranges and values included herein. As described above, the root section 32 is quite thick, facilitating heat flow to the prongs 34 of the pronged fin 14. For example, in certain embodiments, the width 46 of the root section 32 of the pronged fin 14 is greater than the width 48 of the gaps 50 between pronged fins 14 by approximately 50-70%.

As described above, the ratio of the height 44 of the pronged fin 14 to the width 48 of the gaps 50 between pronged fins 14 is generally analogous to the aspect ratio of typical extruded heat sink fins. In particular, the aspect ratio between fins of a heat sink generally refers to the aspect ratio of the area between adjacent fins. When typical heat sinks are extruded, high aspect ratios generally require tall, thin "fingers" in the die that might break off easily due to the forces generated by the extreme pressures present during the extrusion process. As such, using typical extrusion processes, aspect ratios are rarely higher than 16:1. The true definition of an aspect ratio is:

$$AR = H^2/A$$

where AR is the aspect ratio, H is the height, and A is the area between fins 14. For a rectangular area, this equation reduces to simply:

$$AR = H/W$$

because the area A equals height H times width W.

As described above, the disclosed embodiments enable much higher ratios of the height 44 of the fins 14 to the width 48 of the gaps 50 between fins 14 than typical heat sink fins due at least in part to the separate manufacturing of the fins 14. As opposed to conventional techniques where heat sink fins are extruded from the base of the heat sink, manufacturing the pronged fins 14 separate from the base 12 and then assembling the pronged fins 14 and the base 12 enables much higher height-to-width ratios. For example, in certain embodiments, once assembled, the ratio of the height 44 of the pronged fin 14 to the width 48 of the gaps 50 between pronged fins 14 may be within a range of approximately 22:1-26:1. As illustrated in FIG. 5, the imaginary hashed area between the second and third pronged fins 14 (e.g., from left to right) depicts the area which determines the aspect ratio between the pronged fins 14. As described above, the high aspect ratio may utilize the depth (e.g., height) of the ducts, within which the heat sink 10 may be used, to increase the surface area to dissipate more heat.

In addition, each pronged fin 14 will be extruded with a high aspect ratio between prongs 34 of the fin 14. As illustrated in FIG. 5, the width 52 of the prongs 34 may vary slightly from the junction point 36 of the pronged fin 14 to the prong end 38 of the pronged fin 14. Similarly, the width 54 of the gap 56 between the prongs 34 of the fin 14 may vary slightly from the junction point 36 of the pronged fin 14 to the prong end 38 of the pronged fin 14. However, in general, the width 52 of each of the prongs 34 may be within a range of approximately 21-29% of the width 46 of the root section 32 of the pronged fin 14. For example, the width 52 of each of the prongs 34 may be within a range of approximately 1.5-2.5 mm based on the width 46 of the root section 32 of the pronged fin 14 being within a range of 6-10 mm. As such, the width 54 of the gap 56 between the prongs 34 of the fin 14 may be within a range of approximately 42-57% of the width of the pronged fin 14. For example, the width 54 of the gap 56 between the prongs 34 of the fin 14 may be within a range of approximately 3-6 mm based on the width 46 of the pronged fin 14 being within a range of 6-10 mm. However, in other embodiments, these relative and absolute dimensions may vary from the ranges and values included herein.

The aspect ratio of the gap 56 between the prongs 34 of each fin 14 will be within a range of approximately 16:1-20:1. As described above, the true definition of an aspect ratio is:

$$AR = H^2/A$$

where AR is the aspect ratio, H is the height, and A is the area. However, as opposed to the rectangular area between pronged fins 14, because the width 54 of the gap 56 between the prongs 34 of the fin 14 varies slightly from the junction point 36 of the pronged fin 14 to the prong end 38 of the pronged fin 14, the area A is not simply equal to height H times width W. Regardless, using the equation above, the aspect ratio of the gap 56 between the prongs 34 of each fin 14 will be within a range of approximately 16:1-20:1. As illustrated in FIG. 5, the imaginary hashed area between the prongs 34 of the second pronged fin 14 depicts the area which determines the aspect ratio between the prongs 34 of the pronged fins 14. As described above, the relatively high aspect ratio of the area between the prongs 34 increases the surface area for convective heat transfer from each pronged fin 14 as well as increasing the flow area to reduce backpressure, which increases air flow rate.

It should be noted that the relative and absolute dimensions described above are merely exemplary and not intended to be limiting. However, these dimensions are exemplary of the optimization of the heat sink 10 with respect to both performance and manufacturability. For example, the relative and absolute dimensions described herein have been selected to maximize the efficiency of the heat dissipation of the heat sink 10 while also ensuring that the pronged fins 14 may be extruded separately and assembled into the heat sink 10.

Figure 6:
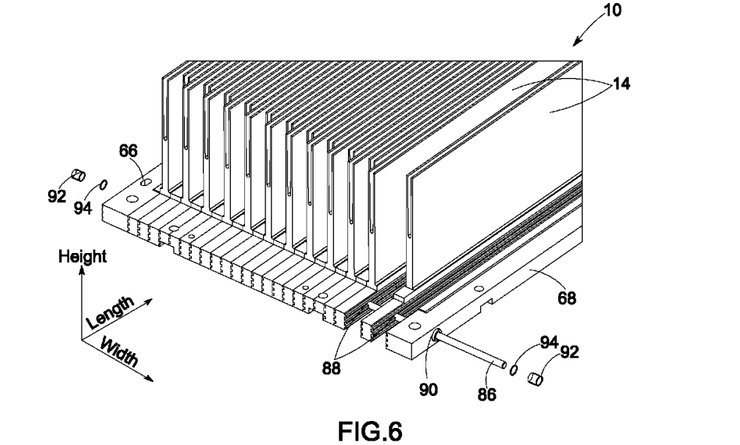
FIG. 6 is a perspective view of an exemplary embodiment of the heat sink having a plurality of pronged fins in the laminated construction configuration of FIG. 4.

As described above, the pronged fins 14 illustrated in FIGS. 4 and 5 include connector ends 64 with interlocking female and male sides 72, 74 that enable the pronged fins 14 to be connected to adjacent pronged fins 14, as well as to the mounting flanges 66, 68 on opposite sides of the plurality of connected pronged fins 14. For example, FIG. 6 is a perspective view of an exemplary embodiment of the heat sink 10 having a plurality of pronged fins 14 in the laminated construction configuration of FIG. 4. As illustrated, once the plurality of pronged fins 14 are assembled between the mounting flanges 66, 68, tie rods 86 may be used to tie the plurality of pronged fins 14 and the mounting flanges 66, 68 together. In particular, the tie rods 86 may traverse the entire width of the base 12 formed by the connector ends 64 of the pronged fins 14 and the mounting flanges 66, 68. Using the tie rods 86 reduces the possibility of displacement at the joints between the connector ends 64 of the pronged fins 14 and the mounting flanges 66, 68, and also helps maintain the flatness of the bottom surface 20 of the heat sink 10. More specifically, the tie rods 86 prevent the base 12 of the heat sink 10 from flexing. In addition, the tie rods 86 reduce the possibility of de-lamination caused by thermal cycling. In certain embodiments, the tie rods 86 may be made of stainless steel. However, in other embodiments, the tie rods 86 may be made of any other suitable material.

The connector ends 64 of the pronged fins 14 and the mounting flanges 66, 68 may have aligned holes 88, 90 through which the tie rods 86 may pass. In certain embodiments, both the tie rods 86 and the holes 88, 90 may be threaded. However, in other embodiments, threading may not be used. As illustrated, in certain embodiments, the holes 90 in the mounting flanges 66, 68 may be countersunk on sides of the mounting flanges 66, 68, wherein the countersunk holes 90 enable nuts 92 and locking hardware 94 to be used to secure the tie rods 86 between the connector ends 64 of the plurality of pronged fins 14 and the mounting flanges 66, 68. Although illustrated as being used on a near end of the heat sink 10, another tie rod 86 will be used on a far end of the heat sink 10 as well. Indeed, in certain embodiments, multiple tie rods 86 may be used along the length of the heat sink 10. As described above, once the connector ends 64 of the plurality of pronged fins 14 and the mounting flanges 66, 68 are connected together, the bottom surface 20 of the base 12 of the heat sink 10 may be laminated to create a smooth bottom surface 20 of the heat sink 10 for equally distributing the heat.

Figure 7:
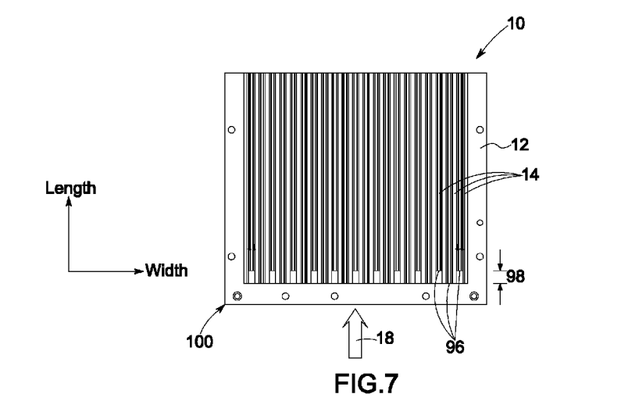
FIG. 7 is a top view of an exemplary embodiment of the heat sink 10 having a plurality of staggered pronged fins in either the bonded construction configuration of FIGS. 2 and 3 or the laminated construction configuration of FIGS. 4 through 6.

FIG. 7 is a top view of an exemplary embodiment of the heat sink 10 having a plurality of pronged fins 14 in either the bonded construction configuration of FIGS. 2 and 3 or the laminated construction configuration of FIGS. 4 through 6. As illustrated, in certain embodiments, the plurality of pronged fins 14 may be staggered. In other words, ends 96 of alternating pronged fins 14 may be offset 98 along the length of the heat sink 10 such that the air flow 18 across the heat sink 10 may be facilitated. For example, as illustrated, odd numbered pronged fins 14 (e.g., along the width of the heat sink 10) may be offset 98 from a near end 100 of the heat sink 10 with respect to even numbered pronged fins 14 (e.g., along the width of the heat sink 10). Staggering the pronged fins 14 in this manner reduces backpressure caused by entrance and exit affects of the air flow across the heat sink 10. As such, pressure losses across the heat sink 10 will be significantly reduced. Lower pressure losses enable higher air flow rates, which enables more efficient heat dissipation. In addition, lower backpressure enables smaller blowers to be used to blow the air across the heat sink 10. Although illustrated as being staggered at one end of the heat sink 10, the pronged fins 14 may be staggered at both leading and trailing ends of the heat sink 10. In addition, although illustrated as the bonded construction configuration in FIG. 7, the laminated construction configuration may also use staggered pronged fins 14 in a similar manner.

Figure 8:
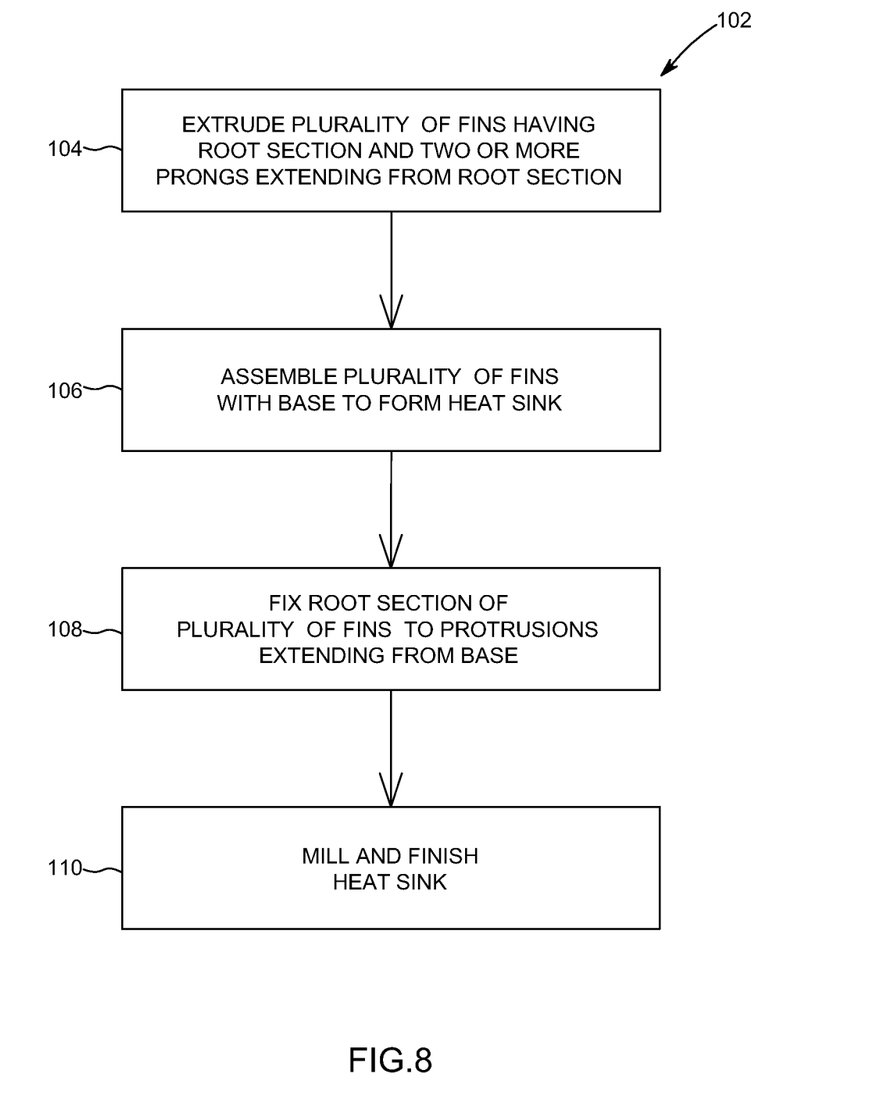
FIG. 8 is a flow chart of an exemplary method of manufacturing the heat sink in the bonded construction configuration of FIGS. 2 and 3.

The heat sinks 10 described herein may be assembled using various methods of manufacturing. For example, FIG. 8 is a flow chart of an exemplary method 102 of manufacturing the heat sink in the bonded construction configuration of FIGS. 2 and 3. In step 104, a plurality of pronged fins 14 having the root section 32 and two or more prongs 34 extending from the root section 32 may be extruded. Extruding the plurality of pronged fins 14 separate from each other facilitates assembly and interchangeability of the pronged fins 14 while also allowing for very high aspect ratios, as described above. Once the plurality of pronged fins 14 have been extruded, in step 106, the plurality of pronged fins 14 may be assembled with the base 12 to form the heat sink 10. In particular, as described above, assembling the heat sink 10 may include aligning the root sections 32 of the plurality of pronged fins 14 within the slots 26 formed between the protrusions 24 extending from the base 12 of the heat sink 10. Once the heat sink 10 has been assembled, in step 108, the root sections 32 of the plurality of pronged fins 14 may be fixed to the protrusions 24 of the base 12. For example, the root sections 32 of the plurality of pronged fins 14 may be brazed to the protrusions 24 of the base 12 as described above, affixed via thermally conductive epoxy, affixed via friction or vibratory welding, or affixed via any other suitable methods. Finally, in step 110, the heat sink 10 may be milled and finished.

Figure 9:
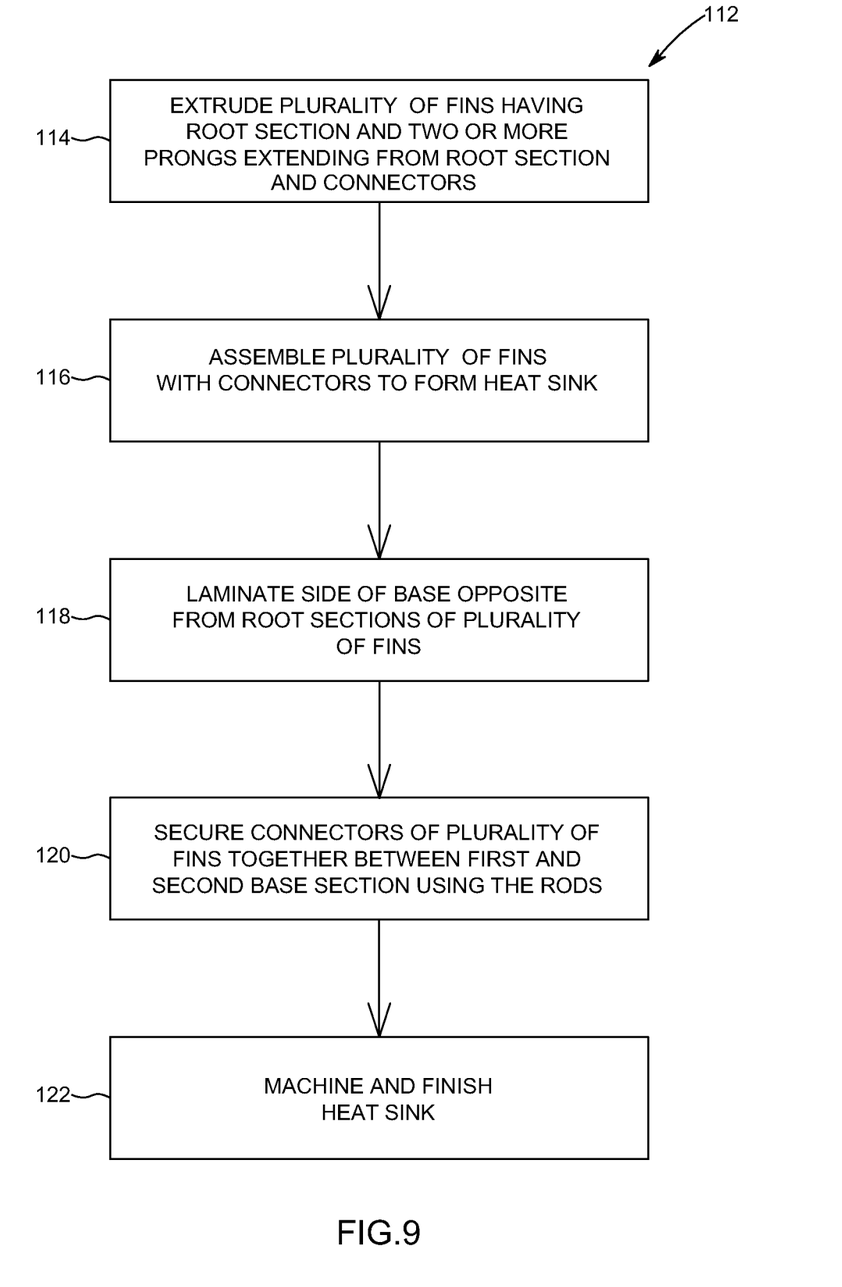
FIG. 9 is a flow chart of an exemplary method of manufacturing the heat sink in the laminated construction configuration of FIGS. 4 through 6.

Conversely, FIG. 9 is a flow chart of an exemplary method 112 of manufacturing the heat sink in the laminated construction configuration of FIGS. 4 through 6. In step 114, a plurality of pronged fins 14 having the root section 32 and two or more prongs 34 extending from the root section 32 may be extruded with connector ends 64. Again, extruding the plurality of pronged fins 14 separate from each other facilitates assembly and interchangeability and high aspect ratios of the pronged fins 14. Once the plurality of pronged fins 14 have been extruded, in step 116, the plurality of pronged fins 14 may be assembled to form the heat sink 10. In particular, as described above, assembling the heat sink 10 may include connecting adjacent pronged fins 14 via connector ends 64, wherein the connector ends 64 of the pronged fins 14 form at least part of the base 12 of the heat sink 10. In certain embodiments, the connector ends 64 may be glued together with the glue filling any voids between the female and male sides 72, 74. In addition, as described above, the first and second mounting flanges 66, 68 will form the other part of the base 12 of the heat sink 10. Once the heat sink 10 has been assembled, in step 118, the bottom side 20 of the base 12 of the heat sink 10 (e.g., a side opposite from the root sections 32 of the plurality of pronged fins 14) may be laminated to create a smooth bottom surface 20 of the heat sink 10 for equally distributing the heat. In addition, in step 120, the connector ends 64 of the plurality of pronged fins 14 may be secured together between the first and second mounting flange 66, 68 using tie rods 86. Finally, in step 122, the heat sink 10 may be machined and finished. The steps of methods 102 and 112 described with respect to FIGS. 8 and 9 may be performed in different orders than described above.

Figure 10:
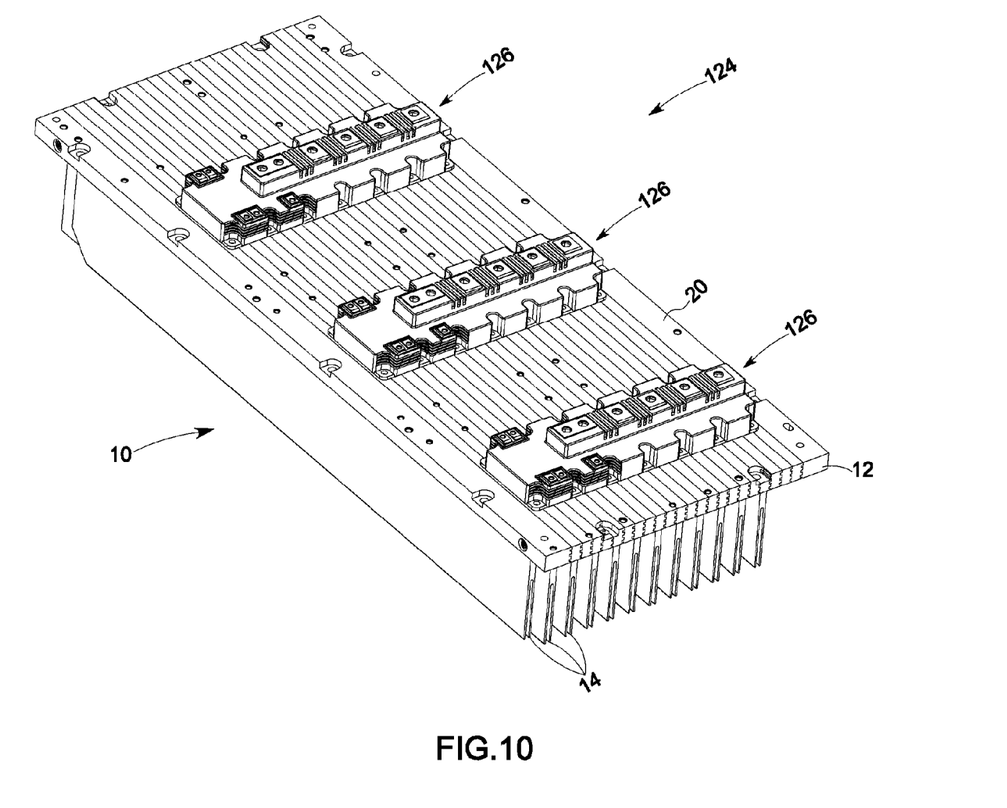
FIG. 10 is a perspective view of an exemplary power electronic device employing the heat sink having a plurality of pronged fins.

The heat sink 10 embodiments described herein may be used in any number of applications where heat may be dissipated. However, as described above, one particular application of the disclosed embodiments may be within power electronic devices. For example, FIG. 10 is a perspective view of an exemplary power electronic device 124 employing the heat sink 10 having a plurality of pronged fins 14. In particular, the illustrated power electronic device 124 is an inverter having three IGBTs 126 that abut the bottom surface 20 of the base 12 of the heat sink 10. The heat sink 10 dissipates heat generated by the IGBTs 126. However, other types of power electronic devices 124 may be used in conjunction with the heat sink 10 having pronged fins 14, as described herein.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A heat sink, comprising:
a base; and
a plurality of extruded fins extending from the base, wherein each of the fins comprises:
a root section having a first end and a second end, wherein a width of the root section is greater than a width between adjacent fins of the plurality of extruded fins by approximately 50-70%; and two or more prongs extending from the first end of the root section.

2. The heat sink of claim 1, wherein a first height-to-width ratio of a first cross-sectional area between adjacent prongs of the two or more prongs is greater than approximately 16:1, and a second height-to-width ratio of a second cross-sectional area between the adjacent fins is greater than approximately 22:1.

3. The heat sink of claim 2, wherein a height-to-width ratio of each of the fins is within a range of approximately 14:1 to 18:1, and wherein a ratio of widths of each of the prongs and the root section is within a range of approximately 21-37%.

4. The heat sink of claim 1, wherein each of the fins comprises a connector extending from the second end of the root section, and wherein each connector of each of the fins is interlocked with each other to form a portion of the base.

5. The heat sink of claim 4, comprising a first mounting flange configured to interlock with a first side of the interlocked connectors of the plurality of fins, and a second mounting flange configured to interlock with an opposite second side of the interlocked connectors of the plurality of fins, wherein the interlocked connectors of the plurality of fins and the first and second mounting flanges comprise the base.

6. The heat sink of claim 5, wherein the base is substantially planar and is laminated on a face of the base opposite the root sections of the plurality of fins.

7. The heat sink of claim 5, comprising a tie rod extending through aligned holes in the connectors of the plurality of fins and the first and second mounting flanges.

8. The heat sink of claim 1, wherein the plurality of fins are staggered lengthwise with respect to the base.

9. A heat sink fin, comprising:
a root section extending from a base end of the heat sink fin to a transition point of the heat sink fin, and
two or more prongs extending from the transition point of the heat sink fin to a tip of the heat sink fin, wherein a distance between two outer most exterior edges of the two or more prongs is substantially similar to a width of the root section, and wherein the root section is continuous from the base end of the heat sink fin to the transition point of the heat sink fin.

10. The heat sink fin of claim 9, wherein a height-to-width ratio of a cross-sectional area between adjacent prongs is greater than approximately 16:1.

11. The heat sink fin of claim 9, comprising a connector extending from the base end of the heat sink fin, wherein a female side of the connector is configured to mate with an opposite male side of an identical connector of an identical heat sink fin.

12. The heat sink fin of claim 11, wherein the female side of the connector comprises one or more indentions, and the male side of the connector comprises one or more protrusions, wherein the one or more indentions are configured to mate with the one or more protrusions.

13. The heat sink fin of claim 11, comprising at least one hole formed in or below the root section and configured to receive a tie rod to couple the heat sink fin to other heat sink fins.

14. A power electronic device comprising the heat sink of claim 1.

* * * * *